United States Patent
Tan

(10) Patent No.: US 9,136,248 B2
(45) Date of Patent: Sep. 15, 2015

(54) MULTI-CHIP STACKED PACKAGE AND METHOD FOR FORMING THE SAME

(71) Applicant: Silergy Semiconductor Technology (Hangzhou) Ltd., Hangzhou (CN)

(72) Inventor: Xiaochun Tan, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 0 days.

(21) Appl. No.: 14/521,809

(22) Filed: Oct. 23, 2014

(65) Prior Publication Data
US 2015/0115425 A1 Apr. 30, 2015

(30) Foreign Application Priority Data
Oct. 25, 2013 (CN) .......................... 2013 1 0513697

(51) Int. Cl.
| | |
|---|---|
| H01L 25/00 | (2006.01) |
| H01L 25/065 | (2006.01) |
| H01L 23/495 | (2006.01) |
| H01L 25/10 | (2006.01) |

(52) U.S. Cl.
CPC ...... *H01L 25/0652* (2013.01); *H01L 23/49575* (2013.01); *H01L 25/105* (2013.01); *H01L 25/50* (2013.01); *H01L 2224/16225* (2013.01); *H01L 2225/06513* (2013.01); *H01L 2225/06524* (2013.01); *H01L 2225/06541* (2013.01); *H01L 2225/1029* (2013.01); *H01L 2225/1058* (2013.01)

(58) Field of Classification Search
CPC ........... H01L 2225/06524; H01L 2225/06513; H01L 2225/06541; H01L 2225/1029; H01L 2225/1058

USPC .................................................. 257/686, 777
See application file for complete search history.

(56) References Cited

U.S. PATENT DOCUMENTS

| | | | | |
|---|---|---|---|---|
| 8,252,629 | B2 * | 8/2012 | Yee et al. ....................... | 438/106 |
| 8,901,727 | B2 * | 12/2014 | Kang et al. ................... | 257/686 |
| 8,922,000 | B2 * | 12/2014 | Han .............................. | 257/713 |
| 2011/0140247 | A1 * | 6/2011 | Pagaila et al. ................. | 257/659 |

FOREIGN PATENT DOCUMENTS

| | | |
|---|---|---|
| CN | 203521406 U | 4/2014 |
| CN | 102832189 B | 7/2014 |
| CN | 103021989 B | 7/2014 |

* cited by examiner

*Primary Examiner* — Roy Potter
(74) *Attorney, Agent, or Firm* — Westman, Champlin & Koehler, P.A.

(57) ABSTRACT

The present disclosure relates to a multi-chip stacked package and a method for forming the same. The package comprises a chip carrier and multiple levels of chips, with one or more chips being arranged in each level, wherein one or more levels of chips, except for the topmost chips, have conductive vias, a patterned conductor layer is arranged on a back surface of a lower one of two chips in two adjacent levels, conductive bumps are provided between two adjacent levels of chips, and the conductive vias of a lower chip are electrically coupled to an upper chip by means of the patterned conductor layer and the conductive bumps. In the present disclosure, electrical connections are redistributed by means of the patterned conductor layer, and are further used for coupling multiple levels of chips by means of the conductive bumps. The resultant chip has a reduced chip size and can be used for electrically coupling various levels of chips, which achieves flexible electrical connections.

11 Claims, 2 Drawing Sheets

MULTI-CHIP STACKED PACKAGE AND METHOD FOR FORMING THE SAME

CROSS-REFERENCE TO RELATED APPLICATION

This application claims the benefit of Chinese Patent Application No. 201310513697.8, filed on Oct. 25, 2013, which is incorporated herein by reference in its entirety.

TECHNICAL FIELD

The present disclosure generally relates to the field of electronic package, and more particularly, to a multi-chip stacked package and a method for forming the same.

BACKGROUND

More and more electronic devices are accommodated in a certain package volume with an increased integration level of electronic devices and miniaturization of electronic products. Both miniaturization of each electronic product and an improved package of electronic devices are required. In a chip package, multiple chips will have a large footprint if being arranged in a plane, and will be difficult to be used in some compact products.

To solve the problem, one skilled person introduces a multi-chip package, in which multiple chips are stacked in a volume and electrically coupled to a substrate by leads. Such a conventional package solves the problem of a large footprint of multiple chips, but the multiple chips in a package are not elaborately arranged and electrically coupled to each other. Actually, electrical connections among the multiple chips are provided by external circuits. Consequently, it is difficult for the conventional multi-chip package to provide electrical connections among the multiple chips in different levels.

SUMMARY

One object of the present disclosure is to provide a multi-chip stacked package and a method for forming the same, which facilitates electrical connections among multiple chips.

According to one aspect of the present disclosure, there is provided a multi-chip stacked package comprising a chip carrier and multiple levels of chips, with one or more chips being arranged in each level, wherein one or more levels of chips, except for the topmost chips, have conductive vias, a patterned conductor layer is arranged on a back surface of a lower one of two chips in two adjacent levels, conductive bumps are provided between two adjacent levels of chips, and the conductive vias of a lower chip are electrically coupled to an upper chip by means of the patterned conductor layer and the conductive bumps.

Preferably, the chip carrier is a lead frame.

Preferably, the patterned conductor layer is a metallic conductor layer.

Preferably, the multiple levels of chips comprise at least a first level of chips and a second level of chips, and each level of the first and second level has at least one chip.

Preferably, the first level of chips comprises two or more chips, and the second level of chips comprises one chip.

Preferably, the second level of chips comprises two or more chips, and the first level of chips comprises one chip.

Preferable, an insulation layer is arranged between the back surface of the lower chip and the patterned conductor layer.

According to another aspect of the present disclosure, there is provided a method for forming a multi-chip stacked package having multiple levels of chips, at least two levels, comprising:

in the multiple levels (at least two levels) of chips, electrically coupling an active region of the lowermost chip to a chip carrier by means of conductive bumps;

forming conductive vias in a lower one of two chips in two adjacent levels, forming a patterned conductor layer at a back surface of an upper one of two chips in two adjacent levels so as to redistribute electrical connections of the conductive vias, which comprises depositing the conductor layer on the back surface of the upper chip and then etching the conductor layer;

electrically coupling the active region of the upper chip to the patterned conductor layer of the lower chip by means of the conductive bumps to provide an electric connection between the upper chip and the lower chip, or to provide an electrical connection with the upper chip.

Preferably, the chip carrier is a lead frame.

Preferably, an insulation layer is arranged on the back surface of the lower chip before forming the conductive vias.

Compared with the prior art, the above embodiments of the structures and methods according to the present disclosure can advantageously provide flexibility of electrical connection by stacking the multiple chips and forming the conductive vias in the chips. The multiple chips are electrically coupled to each other by means of the conductive vias and the conductive bumps, after being stacked one on the other, which provides electrical connection of different levels of chips, without wirings. The conductive vias in the lower chip is redistributed by the patterned conductor layer and then is electrically coupled to the upper chip. The flexibility in the electrical connection broadens the scope of applying the present disclosure.

Figure 1:
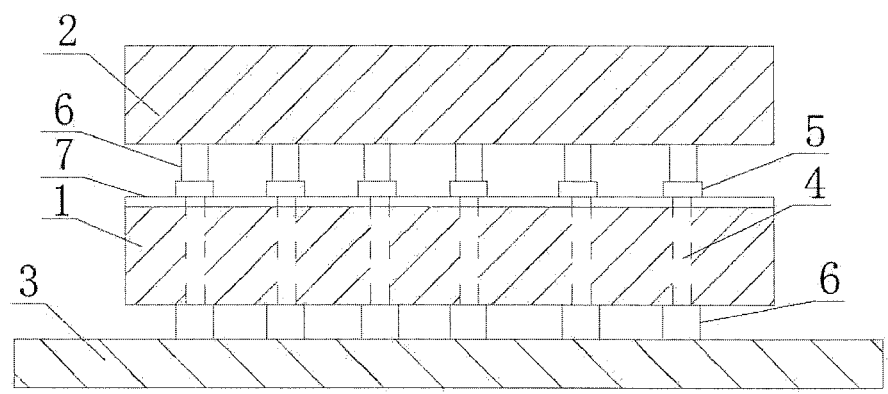
FIG. 1 is a schematic diagram showing an example structure of a multi-chip stacked package according to the first embodiment of the present disclosure.

The reference numerals in the drawings are explained here: 1. the first level of chip; 2. the second level of chip; 3. a chip carrier; 4. conductive vias; 5. a patterned conductor layer; 6. conductive bumps; 7. an insulation layer; and 8. the third level of chip.

DESCRIPTION OF EMBODIMENTS

Reference will now be made in detail to particular embodiments of the disclosure, examples of which are illustrated in the accompanying drawings.

According to the present disclosure, a multi-chip stacked package comprises a chip carrier and multiple levels of chips, with one or more chips being arranged in each level, wherein one or more levels of chips, except for the topmost chips, have conductive vias, a patterned conductor layer is arranged on a back surface of a lower one of two chips in two adjacent levels, conductive bumps are provided between two adjacent levels of chips, and the conductive vias of a lower chip are electrically coupled to an upper chip by means of the patterned conductor layer and the conductive bumps. The back surface of the chip is a surface opposite to an active region. In this embodiment, the active region is located at a lower surface of the chip, and the back surface means an upper surface of the chip.

Embodiment One

Referring now to FIG. 1, two levels of chips are shown, with a first chip 1 in a first level and a second chip 2 in a second level. That is, each of the first and second levels includes one chip, as an example. The first chip 1 is arranged below the second chip 2. The first chip 1 is connected to the chip carrier 3 (for example, a lead frame) by solder bumps 6. Conductive vias 4 are formed in the first chip 1. An insulation layer 7 and a patterned conductor layer 5 are formed successively on an upper surface of the first chip 1. The conductive vias 4 are redistributed by the patterned conductor layer 5 and then electrically coupled to the second chip 2.

Embodiment Two

Figure 2:
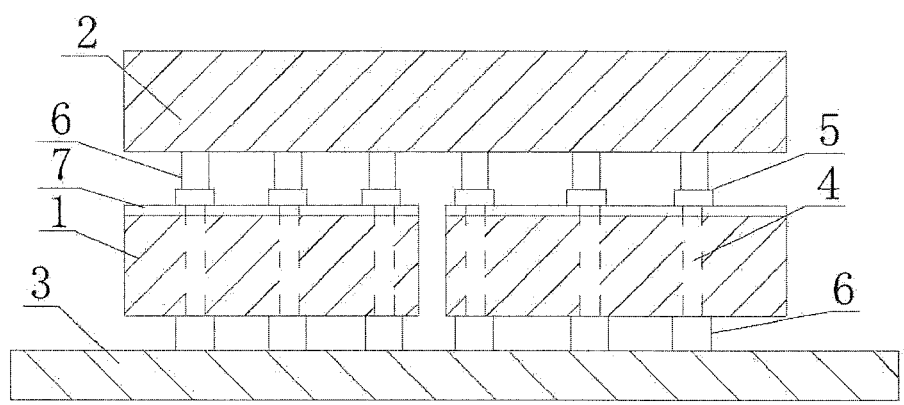
FIG. 2 is a schematic diagram showing an example structure of a multi-chip stacked package according to the second embodiment of the present disclosure.

Referring now to FIG. 2, a multi-chip stacked package according to the second embodiment differs from that according to the first embodiment in that the first level includes two chips 1. Conductive vias are formed in each of the two chips 1. An insulation layer 7 and a patterned conductor layer 5 are formed successively on an upper surface of each of the two chips 1. The conductive vias 4 are redistributed by the patterned conductor layer 5 and then electrically coupled to the second chip 2. Modification may be made in this embodiment. For example, the first level may include two or more chips, and one of the two or more chips in the first level is electrically coupled to the second chip.

Embodiment Three

Figure 3:
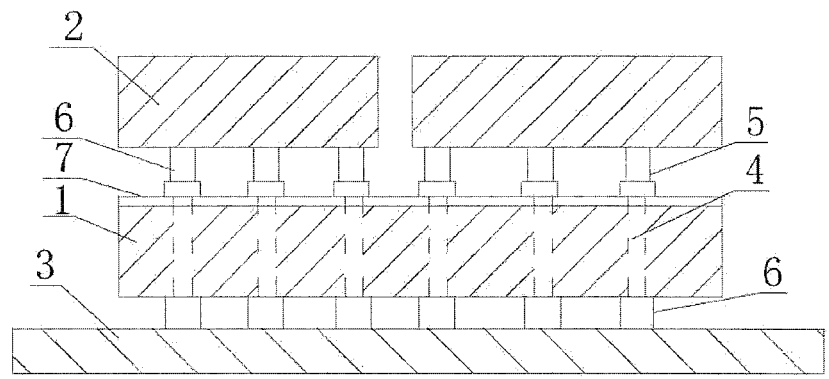
FIG. 3 is a schematic diagram showing an example structure of a multi-chip stacked package according to the third embodiment of the present disclosure.

Referring now to FIG. 3, the multi-chip stacked package according to the third embodiment differs from the first embodiment in that the second level includes two chips 2. Conductive vias are formed in the first chip 1. An insulation layer 7 and a patterned conductor layer 5 are formed successively on an upper surface of the first chip 1. The conductive vias 4 in one chip 1 in the first level are redistributed and electrically coupled to the two chips 2 in the second level. Modification may also be made in this embodiment. For example, the second level may include two or more chips, and the conductive vias in one chip 1 are just electrically coupled to one of the second chips.

Embodiment Four

Figure 4:
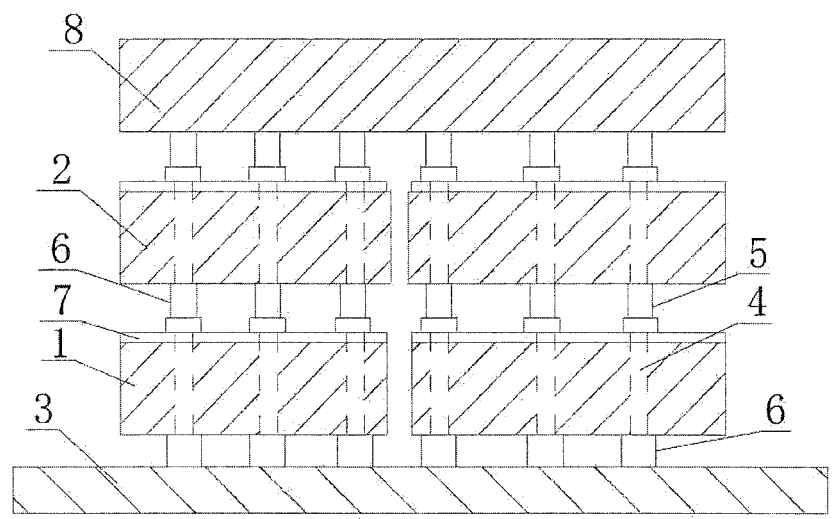
FIG. 4 is a schematic diagram showing an example structure of a multi-chip stacked package according to the fourth embodiment of the present disclosure.

Various embodiments may be combined with each other, and may be modified, instead of being independent from each other. Referring now to FIG. 4, a multi-chip stacked package according to the fourth embodiment is a combination of those according to the embodiments 1 to 3. The multi-chip stacked package has three levels, with two chips 1 in the first level, two chips 2 in the second level, and a chip 8 in the third level. Conductive vias 4 are formed in each of the two first chips 1 in the first level and electrically coupled to corresponding one the two second chips 2 in the second level. Conductive vias are also formed in each of the two second chips 2 in the second level and electrically coupled to third chip 8 in the third level.

Modifications of the fourth embodiments include but are not limited to the case that an electrical connection is provided between the first chips and the second chips, but not between the second chips and the third chip, or the case that an electrical connection is provided between the second chips and the third chip, but not between the first chips and the second chips. Alternatively, all or a part of conductive vias in the first chips are electrically coupled to the third chip by means of the conductive vias in the second chips. Such a variation is an example of the embodiment in which the chips in one of two adjacent levels are secured on and electrically coupled to the chips in the other of the two adjacent levels. Here, the second chips in the second level and the third chip in the third layer can be seen as the two adjacent levels.

According to another aspect of the present disclosure, there is provided a method for forming a multi-chip stacked package having multiple levels of chips, for example, three levels, comprising:

electrically coupling an active region of the lowermost chip to a chip carrier by means of solder bumps, wherein the chip carrier includes but is not limited to a lead frame;

forming conductive vias in both of the first chips in the first level and the second chips in the second level, by firstly forming an insulation layer, forming via holes through the insulation layer, and forming a patterned conductor layer on the insulation layer, so that the conductive vias are electrically coupled to the second chips by redistribution of the patterned conductor layer; electrically coupling the conductive vias in the second chips in the second level to the third chip by redistribution of the patterned conductor layer; or, the conductive vias in the first chips are eclectically coupled to the third chip by means of the conductive vias in the second chips, instead of being electrically coupled to the second chips themselves. Here, the second chips are "conductive paths" for external connections.

The insulation layer PI is the one through which the conductive vias penetrate. The patterned conductor layer is formed by RDL process and redistributes electrical connections so that contact pads can be arranged at the desired locations. Typically, the patterned conductor layer is formed by firstly forming a conductor layer on the back surface of a chip or on an insulation layer and then etching to forming various metal lines so that the electrical connections are redistributed. Vias holes may be formed by chemical etching. The via holes may be blind holes or through holes. For example, the via holes may not penetrate through a lower chip if the lower chip needs only to be electrically coupled to an upper chip. In such case, the via holes may be formed in the lower chips to a depth suitable for contacting electrical devices in the lower chips. The conductive vias are then formed and electrically coupled to the upper chips by means of conductive bumps.

The preferred embodiments of the present disclosure are described in the above paragraphs, but not construed as limiting the present disclosure. Many modifications, equivalence, variations of the preferred embodiments can be made without departing from the doctrine and spirit of the present disclosure.

What is claimed is:

1. A multi-chip stacked package comprising:
   a chip carrier;
   multiple levels of chips, with one or more chips being arranged in each level and;
   a patterned conductor layer on a back surface of a lower one of two chips in two adjacent levels;
   a plurality of first conductive bumps between at least one lowermost chip and said chip carrier,
   a plurality of second conductive bumps between two adjacent levels of chips; and
   wherein one or more levels of chips, except for topmost chips, have conductive vias,
   said plurality of first conductive bumps provide electrical connections with said at least one lowermost chip, and with at least one upper chip, said conductive vias of a lower chip are electrically coupled to an upper chip by means of said patterned conductor layer and said plurality of second conductive bumps.

2. The multi-chip stacked package according to claim 1, wherein said chip carrier is a lead frame.

3. The multi-chip stacked package according to claim 1, wherein said patterned conductor layer is a metallic conductor layer.

4. The multi-chip stacked package according to claim 1, wherein said multiple levels of chips comprise at least a first level of chips and a second level of chips, and each level of said first and second level has at least one chip.

5. The multi-chip stacked package according to claim 4, wherein said first level of chips comprises two or more chips, and said second level of chips comprises one chip.

6. The multi-chip stacked package according to claim 4, wherein said second level of chips comprises two or more chips, and said first level of chips comprises one chip.

7. The multi-chip stacked package according to claim 1, further comprising an insulation layer between said back surface of said lower chip and said patterned conductor layer.

8. A method for forming a multi-chip stacked package having multiple levels of chips, comprising:
   electrically coupling an active region of a lowermost chip to a chip carrier by means of a plurality of first conductive bumps;
   forming conductive vias in a lower one of two chips in two adjacent levels;
   forming a patterned conductor layer at a back surface of an upper one of two chips in two adjacent levels so as to redistribute electrical connections of said conductive vias;
   electrically coupling said active region of said upper chip to said patterned conductor layer of said lower chip by means of a plurality of second conductive bumps to provide an electric connection between said upper chip and said lower chip, so that said plurality of first conductive bumps provide electrical connections with said lowermost chip, and provide an electrical connection with said upper chip.

9. The method for forming the multi-chip stacked package according to claim 8, wherein said chip carrier is a lead frame.

10. The method for forming the multi-chip stacked package according to claim 8, further comprising arranging an insulation layer on said back surface of said lower chip before forming said conductive vias.

11. The method for forming said multi-chip stacked package according to claim 8, wherein forming said patterned conductor layer comprises:
   depositing a conductor layer on said back surface of said upper chip; and
   etching said conductor layer.

\* \* \* \* \*